United States Patent [19]

Okuno et al.

[11] Patent Number: 4,877,760

[45] Date of Patent: Oct. 31, 1989

[54] ALUMINUM NITRIDE SINTERED BODY WITH HIGH THERMAL CONDUCTIVITY AND PROCESS FOR PRODUCING SAME

[75] Inventors: Akiyasu Okuno, Kani; Masakazu Watanabe, Nagoya; Kazuhiko Ikoma, Komaki, all of Japan

[73] Assignee: NGK Spark Plug Co., Ltd., Aichi, Japan

[21] Appl. No.: 39,347

[22] Filed: Apr. 17, 1987

Related U.S. Application Data

[63] Continuation-in-part of Ser. No. 864,879, May 20, 1986, abandoned.

[30] Foreign Application Priority Data

May 22, 1985 [JP]  Japan ................................. 60-111113
May 24, 1985 [JP]  Japan ................................. 60-112330

[51] Int. Cl.[4] ............................................. C04B 35/58
[52] U.S. Cl. ........................................ 501/98; 501/56; 501/153; 501/87
[58] Field of Search ...................... 501/96, 98, 87, 153

[56] References Cited

U.S. PATENT DOCUMENTS 3,215,700  5/1966  Mandorf ............................... 501/98
3,236,663  2/1966  Grulke et al. ........................ 501/98
4,605,633  8/1986  DeAngelis ............................ 501/87
4,693,989  9/1987  Sane .................................... 501/96

*Primary Examiner*—Mark L. Bell
*Assistant Examiner*—Karl Group
*Attorney, Agent, or Firm*—Wegner & Bretschneider

[57] ABSTRACT

AlN-base sintered body with a high thermal conductivity is produced by:

preparing a compact of a material comprising 100 parts by weight of aluminum nitride and 0.1-10 parts by weight, calculated on metal element, of at least one component selected from the group consisting of elements of Groups 4a, 5a and 6a of the Periodic Table, and compounds thereof; and sintering said compact at a temperature ranging from 1500° to 2000° C. under a non-oxidizing atmosphere having a source of boron and/or carbon supply. The compounds include oxides, borides, nitrides and carbides. The elements include W, Mo, Ta and Ti. Oxides are converted to other compounds through sintering. This AlN-base sintered body has good wettability with metal for metallization and enables simultaneous sintering with metallization layer. Multilayer laminated circuit boards or substrates thereof can be produced.

35 Claims, No Drawings

ALUMINUM NITRIDE SINTERED BODY WITH HIGH THERMAL CONDUCTIVITY AND PROCESS FOR PRODUCING SAME

This application is a Continuation In Part Application of U.S. patent application Ser. No. 864,879 filed on May 20, 1986 abandoned.

BACKGROUND OF THE INVENTION

The present invention relates to an aluminum nitride sintered body with a high thermal conductivity for use in an insulating substrate, heat sink and the like. More particularly, it relates to a high thermal conductive aluminum nitride sintered body which is easily metallized.

In recent years, the requirements for minimizing elecronic instruments and improving their functions have increased prominently. As a result, semiconductors are rapidly developing towards improvements in Integration density, multifunctionization, high speed, high output and high responsibility, wherein more and more heat is generated by the semiconductor. Therefore, a base plate with higher heat-dissipation (or radiation) ability is needed instead of conventional $Al_2O_3$ base substrates.

As the materials for substrates with high heat-dissipation ability, i.e., as the materials with high thermal conductivity, there are included, for example, diamond, CBN (cubic boron nitride), SiC (silicon carbide), BeO (beryllia), AlN (aluminum nitride), Si, and the like. However, these materials have following drawbacks. Diamond and CBN have a difficulty in manufacturing the product of such size usable as a substrate and are very expensive. SiC cannot be used instead of an $Al_2O_3$ substrate since SiC is semiconductive and inferior in electric characteristics such as electric insulating ability, dielectric constant and the like, compared with $Al_2O_3$. BeO, in spite of its excellent electric characteristics, has a difficulty in its stable supply since it is not manufactured in Japan depending on the import from foreign contries, due to the poisonous powder produced in the compacting process, abrasive machining process and the like.

Si has inferior electric characteristics and a low mechanical strength, and hence has a limited use as the material for the substrate. Althogh AlN has advantages that it is excellent in electric characteristics, for example, high insulating ability, high dielectric brake down strength, low dielectric constant, etc. and that it can be sintered under atmospheric pressure, it has a drawback that the metal layer cannot be formed on the required surface. In AlN, therefore, a substrate with multi-layers has never been developed. That is, AlN cannot be easily metallized because of a low wettability to metal, and hence it has a difficulty in use as a substrate.

For example, Japanese Patent Kokai Publication Nos. 50-75208 and 59-40404 disclose oxidizing of the surface of an AlN base plate before metallization, and Japanese Patent Kokai Publication No. 53-102310 discloses formation of metal oxide layer on the surface of AlN base plate before metallization.

The above-disclosed techniques, in spite of the possibility of the metallization on the AlN sintered product, have the drawbacks that they cannot be employed in a simultaneous sintering for multilayer-products like laminated circuit boards or substrates thereof, and that they always deteriorate the thermal conductivity caused by formation of a low thermal conductive layer (e.g., oxide layer) between a metallized metal layer and the AlN substrate.

SUMMARY OF THE DISCLOSURE

It is a primary object of the present invention to provide an AlN-base material for an AlN substrate which has a high thermal conductivity and excellent electric characteristics.

It is another object of the present invention to provide an AlN-base material for an AlN substrate which has an excellent wettability with metal and is easily metallized, and to provide, particularly, an AlN-base material for an AlN substrate which does not deteriorate the thermal conductivity through metallization.

It is a further object of the present invention to provide an AlN-base material which can be made to a multilayer products comprising metallization like laminated circuit boards or substrates therefor.

It is a still further object of the present invention to provide a process for producing an AlN-base material for an AlN substrate which satisfies the above-described various characteristics.

It is a still further object of the present invention too provide an insulating substrate of electronic circuit or a heat sink (i.e., one of protective apparatus absorbing heat to cover it), comprising an AlN-base material which satisfies the above-described various characteristics.

Still other objects of the present invention will become apparent in the entire disclosure.

According to a first aspect of the present invention, there is provided an AlN-base sintered body consisting essentialy of 100 parts by weight of aluminum nitride and 0.1-10 parts by weight of at least one component selected from the group consisting of borides of elements of Groups 4a, 5a and 6a of the Periodic Table, and nitrides of elements of Groups 4a and 5a of the Periodic Table (the amount of boride and nitride is expressed in terms of the metal element; the same definition applies hereinafter, unless otherwise specified).

According to a second aspect of the present invention, there is provided an AlN-base sintered body consisting essentially of 100 parts by weight of aluminum nitride and 0.1-10 parts by weight of the sum of at least one component selected from the group consisting of carbides of metal elements of Group 4a, 5a and 6a of the Periodic Table and the above-described at least one component of borides and nitrides in accordance with the first aspect.

In the AlN-base sintered bodies according to the first and second aspects, the thermal conductivity is high, electrical characteristics are excellent, and the wettability with metal is significantly improved. The reason why the wettability with metal is significantly improved is thought to be due to the existence of the boride, etc. between AlN crystal grains (that is, in the AlN grain boundary) without forming solid solution with AlN-grains.

Generally, it has long been believed that the existence of an additive between grains deteriorates the thermal conductivity. In the first and second aspects, however, the high thermal conductivity does not decrease in spite of the existence of the boride, etc. between the AlN grains. The reason is thought to be attributable to no hindrance to the mutual bonding between AlN grains, since this additive does not form other compounds by the reaction with AlN and it does not entirely cover each grain of AlN.

According to the third aspect of the present invention, there is provided a process for producing an AlN-base sintered body which comprises preparing a compacted material comprising 100 parts by weight of aluminum nitride and 0.1-10 parts (in terms or metal element) of at least one component selected from the group consisting of elements of Groups 4a, 5a and 6a of the Periodic Table, and compounds thereof; and sintering said material at 1500°-2000° C. under a non-oxidizing atmosphere including a source of boron and/or carbon supply.

In the third aspect of the present invention, there can be produced the aluminum nitride-base sintered body which is excellent in various characteristics, such as thermal conductivity and the like, as shown in the above first and second aspects.

The application of the third aspect to the process for production of an IC-substrate and the like, provides an easy production of multilayer products of the laminated structure like laminated circuit boards or substrates thereof having metallization layers therein interposed and/or thereon by simultaneous sintering, wherein an oxidizing treatment, etc. for the surface of the substrate is not required, contrary to the conventional methods.

In the above various aspects of the present invention, the elements of Group 4a of the Periodic Table include Ti, Zr and Hf; the elements of Group 5a include V, Nb and Ta; and the elements of Group 6a include Cr, Mo and W. The naming of Groups in the Periodic Table depends on the international Periodic Table. See, for example, Physical Chemistry, 1960, D. Van Nostrand Co., Inc. (Marusen Asian Edition) pp. 163.

DESCRIPTION OF THE PREFERRED EMBODIMENTS

Borides and nitrides of the elements of Groups 4a, 5a and 6a of the Periodic Table (in the first aspect); borides and nitrides and carbides of the elements thereof (in the second aspect); and elements (metals) or compounds thereof (in the third aspect) are present in a range of 0.1-10 parts, based on 100 parts of AlN in any aspect (unless otherwise specified "parts" represents parts by weight). This range is selected from the following reasons. That is, the wettability of AlN-sintered body with metal is not improved below this range, and the thermal conductivity of AlN-base sintered body and the sintering easiness are deteriorated above this range.

Referring to the embodiment, the AlN-base sintered body comprising the above components in this range provides a thermal conductivity of at least about 0.15 cal/cm sec °C. (at room temperature), a specific resistivity of at least about $10^9$ Ω-cm and a peeling strength of at least about 1.0 kg/mm². In more preferable range, the sintered body has a thermal conductivity of at least 0.2 cal/cm sec °C., a specific resistivity of at least $10^{12}$ Ω-cm and a peeling strength of at least 2 kg/mm².

The amount of the above components is prefeably in a range of 1-5 parts, more preferably 1-3 parts, based on 100 parts of AlN.

Among borides, nitrides and carbides of the elements of Groups 4a, 5a and 6a of the Periodic Table in the first and second aspects, the borides of Ti (in Group 4a), Ta (in Group 5a), Mo and W (in Group 6a) are preferred. The AlN-base sintered body comprising these components in a range of 1-3 parts, based on 100 parts by weight of AlN, provides a peeling strength of at least 2.0 kg/mm². Particularly, $Mo_2B$, $W_2B$, the combination of $Mo_2B$ and $Mo_2C$, or a combination of $W_2B$ and $W_2C$ is most preferred.

The AlN-base sintered product comprising the most preferred components in a range of 1-3 parts, based on 100 parts by weight of AlN, provides a peeling strength of at least 4.0 kg/cm².

Among the elements (metals) of Groups 4a, 5a and 6a of the Periodic Table, and the compounds thereof in the third aspect, preferred are the elementary Ti (in Group 4a), Ta (in Group 5a), and Mo and W (in Group 6a); oxides thereof; or compounds which form these elements or the oxide thereof by heat-treatment,—such as sulfate, ammonium salt, hydroxide, etc. of Ti and the like.

The AlN-base sintered body comprising the above components in a range of 1-5 parts, based on 100 parts by weight of AlN, generally provides a peeling strength of at least 2.0 kg/cm². Among them, the oxides of the elements of Group 6a, such as $MoO_3$, $WO_3$ and the like, are most preferred, wherein the AlN-sintered body comprising these oxides in a range of 1-3 parts, based on 100 parts by weight of AlN, provides a peeling strength of at least 4.0 kg/mm².

The AlN-base sintered body obtained by using the above material-components contains borides, nitrides, carbides or a mixture thereof to which the above elements were converted.

A satisfactory result is obtained by using only the above components. However, the AlN-base sintered body of the present invention may contain optionally certain amounts of sintering aids, such as $Y_2O_3$, CaO, etc., usually in a range of at most 5 parts, based on 100 parts of AlN. The sintering aids include, for example, oxides of alkaline earth metal such as CaO, BaO, MgO, SrO; oxides of rare earth metal such as $Y_2O_3$, CeO, $La_2O_3$, $Sm_2O_3$, etc., which are known per se. The term "AlN-base sintered body" denotes ones including such sintering aids. In the present invention the presence of the sintering aids exceeding 5 parts is not preferred since it deteriorates the peeling strength.

The AlN-base sintered body comprising 1-5 (more preferably 1-3) parts of the sintering aids, based on 100 parts by weight of AlN, provides a higher thermal conductivity, maintaining an almost equivalent peeling strength, compared with that containing no sintering aids.

Further, with a relative density (%, based on the theoretical density) of at least 90%, the thermal conductivity and the adhesion strength of the metallization (metallized layer) are increased. Below 90% the thermal conductivity becomes inferior to alumina. The relative density of the AlN-base sintered body is preferably at least 95%, more preferably at least 97%.

The strength of the AlN-base sintered body as such is preferably at least about 30 kg/mm² usually ranging up to about 50 kg/mm².

The average grain size of crystals of the AlN-base sintered body is preferably in a range of 0.5-10 μm (more preferably 0.5-5 μm, and most preferably 2-5 μm). Generally the thermal conductivity increases as the crystal grain size increases. However, above that range the mechanical strength decreases. Below that range the sintered density is sufficient entailing a low thermal conductivity.

In the third aspect of the present invention, the powders of aluminum nitride and the above element and/or the above compound are thoroughly mixed by using a ball mill, etc.

The amount of boron and/or carbon supply is such that the metal elements (or those produced in situ during sintering) may be converted into borides and/or carbides.

As a source of boron supply, there may be used, for example, borane for addition into the atmosphere, boric acid and boron oxide for addition to the mixture, boron nitride used as a mold-removing agent, and the like. It is required that the above sources are added in an amount sufficient to form boride of all the elements of Groups 4a, 5a and 6a of the Periodic Table and/or the compounds thereof contained in the above mixture. However, a sufficient result is obtained when an amount of boron nitride used as the mold-removing agent is present in the above mixture, since the above element and the above compound are necessary only in a small amount. Therefore, it is preferable to use boron nitride as a mold-removing agent for the source of boron supply, since another source of boron supply is not required.

As a source of carbon supply, there may be used, for example, carbonaceous compounds for addition to the mixture, carbon black, carbon sagger for sintering, carbon used as a heating element, and the like. A sufficient result is obtained, when an amount of carbon supplied from carbon as a heating element or sagger is present in the mixture since the amount required is small like the above case with boron.

Therefore, it is preferred to use the sagger or heating element as a source of carbon supply, since, then, another source of carbon supply is not particularly required.

As the non-oxidizing atmosphere, use may be made of nitrogen, argon, hydrogen, ammonia-decomposition gas and the like.

It is required that a sintering temperature should be in a range of 1500°–2000° C. The sintering is insufficient at a temperature below the range, and aluminum nitride begins to decompose at a temperature above the range. The sintering temperature is preferably in a range of 1600°–1900° C., more preferably 1700°–1800° C. Within that range the lower temperature brings about a smaller crystal grain size (e.g., 0.5 $\mu$m), a lower density and a lower thermal conductivity while the higher temperature brings about a larger grain size and a larger thermal conductivity but a lower mechanical strength. The temperature of 1700°–1800° C. provides an optimum grain size of 2–5 $\mu$m.

As to the wettability with metal, it is appreciated from the examples that a metallizing past with a simplest composition (i.e., without containing any inorganic binder component) can be metallized with ease resulting in an excellent peeling strength. Sicne only metal is enough as the inorganic component contained in the paste to be applied, the resultant metallized layer does not contain any oxide layers or the like harmful layers in light of the thermal conductivity.

EXAMPLE 1

To 100 parts of AlN-powder (an average particle diameter : 1.0 $\mu$m), there was added each of boride-powder, nitride-powder and carbide-powder (all of an average particle diameter : 2 $\mu$m or less) is an amount in terms of the metal element, as shown in Table 1, to prepare a mixture. The mixture was wet-mixed in ethanol for 4 hours by using a ball mill to produce a material-powder mixture. Then, there were produced samples for testing density and thermal conductivity and samples for testing wettability with metal. The density and thermal conductivity were measured for the samples which had been produced by compacting the material-powder at a molding pressure of 1.5 ton/cm² to prepare compacts of 11 mm in diameter and 3 mm thick and by sintering these compacts at normal pressure in nitrogen atmosphere (pressure of 760 Torr) for 1 hour. The density was determined as the relative density (the ratio of apparent density to theoretical density; %).

The composition of the samples was determined by using an X-ray diffraction apparatus after the samples had been pulverized in an agate-mortar.

The thermal conductivity was determined by a laser flash method after the samples had been processed by using a planer grinder to prepare a product of 2 mm thick.

The specific resistivity was measured by a insulating resistance meter, after using the same samples as for the thermal conductivity a silver paste is applied on both sides of said each sample to be electrodes.

The wettability with a metal was measured in terms of the adhesion strength of the metallized layer, which was carried out as follows. The material-powder was compacted at a molding pressure of 1.5 ton/cm² to prepare samples of 30×10×5 mm. A paste containing 95% by weight of metallic W-powder, (an average particle diameter : 1.0 $\mu$m) the balance being orgaic binder (ethyl cellulose) diluted with a solvent (butyl carbitol) was coated on the surface of the compacts to prepare a coating film of 2×2 mm area and a 20 $\mu$m thickness. The coated compacts were dried, and sintered at normal pressure for 1 hour under nitrogen atmosphere (pressure of 760 Torr) at 1700° C. resulting in sintered bodies. After allowed to cool, a Ni-layer of 2–5 $\mu$m was produced on the surface of the sintered bodies by Ni-electroplating method, and heat was applied thereto at 850° C. for 10 minutes. Thereafter, an 1×1 mm Kovar (nickel alloy containing both cobalt and iron) plate was brazed at 930° C. for 5 minutes by using an eutectic silver solder, wherein the adhesion strength was determined as the peeling strength. Note that the application of the Ni-electroplating is usual, in the art as an intermittent layer for brazing on the surface of metallization.

The peeling strength is a strength in which the above Kovar plate was peeled from the sintered bodies when a lead wire jointed to the above Kovar-plate was pulled in a direction perpendicular to the adhesive surface at a speed of 0.5 mm/sec.

Table 1 shows the tested results of the relative density, thermal conductivity, specific resistivity and peeling strength. In this case, sample Nos. 1–42 are examples in the first aspect of the present invention, and sample Nos. 43–56 are examples in the second aspect.

The balance of the composition shown in Table 1 means AlN, and the unit of the amount in the composition is expressed as parts by weight (in terms of metal element), based on 100 parts by weight of AlN.

TABLE 1

| Sample No. | Composition** | Properties | Amount* 0.05 | 0.1 | 1.0 | 3.0 | 5.0 | 10 | 15 |
|---|---|---|---|---|---|---|---|---|---|
| 1–7 | $TiB_2$ | RD | 98.5 | 98.5 | 98.1 | 97.8 | 97.3 | 91.5 | 83.0 |
|  |  | TC | 0.230 | 0.225 | 0.231 | 0.222 | 0.215 | 0.171 | 0.080 |
|  |  | PS | <0.5 | 1.2 | 3.1 | 4.2 | 2.3 | 1.1 | <0.5 |
|  |  | SR | $>10^{14}$ | $>10^{14}$ | $5 \times 10^{14}$ | $1 \times 10^{14}$ | $1 \times 10^{13}$ | $1 \times 10^{10}$ | — |
| 8–14 | $TaB_2$ | RD | 98.5 | 98.5 | 97.8 | 97.3 | 96.5 | 90.3 | 81.0 |
|  |  | TC | 0.227 | 0.218 | 0.220 | 0.218 | 0.208 | 0.161 | 0.070 |
|  |  | PS | <0.5 | 1.1 | 2.0 | 2.3 | 1.9 | 1.3 | <0.5 |
|  |  | SR | $>10^{14}$ | $>10^{14}$ | $5 \times 10^{14}$ | $8 \times 10^{13}$ | $9 \times 10^{12}$ | $8 \times 10^{9}$ | — |
| 15–21 | $Mo_2B$ | RD | 98.5 | 98.5 | 98.0 | 97.5 | 96.8 | 91.2 | 87.3 |
|  |  | TC | 0.221 | 0.217 | 0.218 | 0.201 | 0.195 | 0.151 | 0.070 |
|  |  | PS | <0.5 | 1.0 | 4.3 | 5.1 | 2.8 | 1.2 | <0.5 |
|  |  | SR | $>10^{14}$ | $>10^{14}$ | $8 \times 10^{14}$ | $3 \times 10^{14}$ | $2 \times 10^{13}$ | $9 \times 10^{9}$ | — |
| 22–28 | $W_2B$ | RD | 98.5 | 98.5 | 98.1 | 97.8 | 96.5 | 91.5 | 85.0 |
|  |  | TC | 0.218 | 0.215 | 0.215 | 0.210 | 0.200 | 0.173 | 0.071 |
|  |  | PS | <0.5 | 1.2 | 4.5 | 5.5 | 3.0 | 1.8 | <0.5 |
|  |  | SR | $>10^{14}$ | $>10^{14}$ | $8 \times 10^{14}$ | $3 \times 10^{14}$ | $2 \times 10^{13}$ | $8 \times 10^{9}$ | — |
| 29–35 | TiN | RD | 98.5 | 98.5 | 98.0 | 97.7 | 96.5 | 91.0 | 85.3 |
|  |  | TC | 0.220 | 0.213 | 0.210 | 0.208 | 0.188 | 0.158 | 0.065 |
|  |  | PS | <0.5 | 1.1 | 2.3 | 2.1 | 1.8 | 1.2 | <0.5 |
|  |  | SR | $>10^{14}$ | $>10^{14}$ | $5 \times 10^{14}$ | $8 \times 10^{13}$ | $8 \times 10^{12}$ | $5 \times 10^{9}$ | — |
| 36–42 | TaN | RD | 98.5 | 98.4 | 97.6 | 97.0 | 96.3 | 90.0 | 81.0 |
|  |  | TC | 0.231 | 0.220 | 0.208 | 0.205 | 0.183 | 0.151 | 0.063 |
|  |  | PS | <0.5 | 1.0 | 3.0 | 2.8 | 1.9 | 1.1 | <0.5 |
|  |  | SR | $>10^{14}$ | $>10^{14}$ | $5 \times 10^{14}$ | $1 \times 10^{14}$ | $9 \times 10^{12}$ | $5 \times 10^{9}$ | — |
| 43–49 | $Mo_2B$ + $Mo_2C$ (1:1) | RD | 98.5 | 98.5 | 98.1 | 97.5 | 96.7 | 91.3 | 83.0 |
|  |  | TC | 0.230 | 0.221 | 0.218 | 0.213 | 0.205 | 0.173 | 0.080 |
|  |  | PS | <0.5 | 1.5 | 5.4 | 6.6 | 3.1 | 1.5 | <0.5 |
|  |  | SR | $>10^{14}$ | $>10^{14}$ | $8 \times 10^{14}$ | $3 \times 10^{14}$ | $2 \times 10^{13}$ | $1 \times 10^{10}$ | — |
| 50–56 | $W_2B$ + $W_2C$ (1:1) | RD | 98.5 | 98.5 | 98.0 | 97.7 | 96.5 | 91.1 | 84.0 |
|  |  | TC | 0.225 | 0.218 | 0.213 | 0.210 | 0.200 | 0.168 | 0.078 |
|  |  | PS | <0.5 | 1.3 | 5.1 | 5.8 | 3.0 | 1.3 | <0.5 |
|  |  | SR | $>10^{14}$ | $>10^{14}$ | $8 \times 10^{14}$ | $3 \times 10^{14}$ | $2 \times 10^{13}$ | $1 \times 10^{10}$ | — |

Notes
*Amount is given in parts by weight (in terms of metal element), based on 100 parts by weight of AlN.
RD: Relative density
TC: Thermal conductivity (RT) (cal/cm · sec. °C.)
PS: Peeling strength (kg/mm$^2$)
SR: Specific resistivity (Ω-cm)
**Composition of starting material As seen in Table 1 of the Example, it was found that there were obtained sintered products with a high thermal conductivity, a high insulating ability and a high peeling strength, i.e., an excellent wettability with metal, by using AlN comprising at least one component selected from the group consisting of borides and nitrides of metal elements of Groups 4a, 5a and 6a of the Periodic Table, and optionally further at least one component selected from the group consisting of carbides of said metal elements, in a range of 0.1–10 parts by weight (in terms of metal element), based on 100 parts by weight of AlN.

Further, in the cases with other metals other than Table 1, there are also obtained sintered products with a high thermal conductivity, a high insulating ability and a high peeling strength by using AlN comprising at least one component selected from the group consisting of borides of elements of Groups 4a, 5a and 6a of the Periodic Table and nitrides of elements of Groups 4a and 5a of the Periodic Table, and optionally further at least one component selected from the group consisting of the carbides of elements of Groups 4a, 5a and 6a of the Periodic Table, in a range of 0.1–10 parts by weight (in terms of metal element), based on 100 parts by weight of AlN. That is, such sintered product was as excellent as those shown in Table 1.

The conventional AlN-sintered products (a relative density of 99%) has a thermal conductivity of 0.14–0.24 cal/cm sec °C. (at room temperature) and a peeling strength of less than 0.5 kg/mm$^2$. And sintered Al$_2$O$_3$ (a relative density : 99%) has a thermal conductivity of 0.04–0.07 cal/cm sec °C. and a peeling strength of 2–5 kg/mm$^2$.

Then, to 100 parts by weight of AlN-powder (an average particle diameter of 1.0 μm), there were added 3 parts by weight (in terms of Mo) of Mo$_2$B (an average particle diameter of 2.0 μm) to prepare a mixture. To the mixture, there was added CaO as a sintering aid, wherein the relative density, thermal conductivity and peeling strength were determined. The tested results are shown in Table 2.

TABLE 2

| Sample | 57 | 58 | 59 | 60 | 61 |
|---|---|---|---|---|---|
| Amount of CaO** | — | 1 | 3 | 5 | 10 |
| Relative density (%) | 97.5 | 98.0 | 98.0 | 97.8 | 91.1 |
| Thermal conductivity (RT) (cal/cm · sec. °C.) | 0.201 | 0.215 | 0.213 | 0.200 | 0.170 |
| Peeling Strength (kg/mm$^2$) | 5.1 | 5.0 | 4.5 | 4.1 | not measurable |

Note
**Amount of CaO is given in parts by weight of CaO, based on 100 parts by weight of AlN.

As seen in Table 2, the thermal conductivity shows high values at the CaO amounts of up to 5 parts by weight, based on 100 parts by weight of AlN, while maintaining almost the same peeling strength. However, in an amount of 10 parts by weight of CaO (Sample 3e), based on 100 parts by weight of AlN, the precipitations considered to be caused by a liquid phase of $Ca_3Al_2O_6$ etc. formed during sintering were produced to a significant extent, so that determination of the peeling strength was impossible.

EXAMPLE 2 (IN THE THIRD ASPECT)

To 100 parts of AlN-powder (an average particle diameter : 1.0 μm), there was added each of the elements and the oxides (an average particle diameter : 1.0 μm) of elements of Group 4a, 5a and 6a of the Periodic Table in an amount (in term of metal element) as shown in Table 3 to prepare a mixture. The mixture was wet-mixed in ethanol for 4 hours to prepare a material-powder.

The material-powder was molded, and was sintered under nitrogen atmosphere having a source of boron and/or carbon supply, as shown in Table 3. In this manner, there were produced a sample for testing a density, a thermal conductivity and a produced compound, and a sample for testing the wettability with metal.

The characteristics of these samples were determined in the same manner as in Example 1.

Table 3 shows the test results of relative density, thermal conductivity and peeling strength.

The balance of the composition shown in Table 3 means AlN, and the unit of the amount in the composition is expressed as parts by weight (in term of metal element), based on 100 parts by weight of AlN.

As seen in Table 3 of this Example, it was found that there were obtained sintered products having a high thermal conducitvity (about 0.15 cal/cm sec °C.) and a high peeling strength (at least about 1 kg/mm²). Further, at a sintering temperature of less than 1500°C., the sintered products have a lower strength and a lower thermal conductivity. And at a sintering temperature of more than 2000° C., AlN begins to decompose. Further, in the cases with other metals other than Table 3 (in the same procedure as in this Example), there are obtained sintered products having a high thermal conductivity and a high peeling strength, i.e., a high wettability with metal by using AlN containing elementary metals of Groups 4a, 5a and 6a of the Periodic Table or the compounds thereof in a range of 0.1–10 parts (in terms of elementary metal), based on 100 parts by weight of AlN.

Furthermore, for the production of AlN-sintered products having a high thermal conductivity and a high peeling strength under an ammonia-decomposition gas atmosphere instead of nitrogen gas atmosphere, it is required that the green materials for the defined AlN-sintered products comprise the above elementary metals and/or the compounds thereof in a range of 0.1–10 parts (in terms of elementary metals), based on 100 parts by weight of AlN.

It should be noted that modifications may be done without departing from the gist and scope of the present invention as disclosed and claimed.

What is claimed is:

1. An aluminum nitride-base sintered body with high thermal conductivity, excellent wettability to metal and a specific resistivity of at least $10^9$ ohm-cm which:
   (a) consists essentially of
      100 parts by weight of aluminum nitride and 0.1–10 parts by weight, of at least one metal boride of elements of Groups 4a (Ti, Zr, Hf), 5a (V, Nb and Ta) and 6a (Cr, Mo, W) of the International Periodic Table, calculated as the metal of said metal boride and
   (b) has a mean crystal grain size not exceeding 10 μm.

TABLE 3

| Sample No. | Composition** | Properties | Amount* 0.05 | 0.1 | 1.0 | 3.0 | 5.0 | 10 | 15 | Composition of sintered product |
|---|---|---|---|---|---|---|---|---|---|---|
| 62–68 | Ti | RD | 98.5 | 98.5 | 98.3 | 98.0 | 97.0 | 91.3 | 81.0 | $TiB_2$, |
|  |  | TC | 0.230 | 0.228 | 0.225 | 0.213 | 0.205 | 0.168 | 0.073 | TiC, |
|  |  | PS | <0.5 | 1.3 | 3.0 | 3.1 | 2.3 | 1.7 | <0.5 | TiN |
| 69–75 | Ta | RD | 98.5 | 98.5 | 98.0 | 97.5 | 96.8 | 90.8 | 80.5 | $TaB_2$, |
|  |  | TC | 0.228 | 0.230 | 0.220 | 0.209 | 0.200 | 0.163 | 0.070 | TaC, |
|  |  | PS | <0.5 | 1.1 | 3.1 | 3.5 | 2.1 | 1.0 | <0.5 | TaN |
| 76–82 | Mo | RD | 98.5 | 98.5 | 98.4 | 98.3 | 97.1 | 91.1 | 82.0 | $Mo_2B$, |
|  |  | TC | 0.223 | 0.221 | 0.219 | 0.213 | 0.201 | 0.161 | 0.081 | $Mo_2C$ |
|  |  | PS | <0.5 | 1.2 | 3.3 | 4.0 | 2.1 | 1.1 | <0.5 |  |
| 83–89 | W | RD | 98.5 | 98.5 | 98.3 | 98.1 | 96.5 | 90.5 | 81.1 | $W_2B$, |
|  |  | TC | 0.220 | 0.222 | 0.215 | 0.210 | 0.203 | 0.158 | 0.075 | $W_2C$ |
|  |  | PS | <0.5 | 1.2 | 3.5 | 4.1 | 2.5 | 1.2 | <0.5 |  |
| 90–96 | $TiO_2$ | RD | 98.5 | 98.5 | 98.0 | 97.8 | 96.3 | 90.4 | 81.8 | $TiB_2$, |
|  |  | TC | 0.225 | 0.220 | 0.213 | 0.205 | 0.200 | 0.155 | 0.080 | TiC, |
|  |  | PS | <0.5 | 1.4 | 2.0 | 2.1 | 1.8 | 1.5 | <0.5 | TiN |
| 97–103 | $Ta_2O_5$ | RD | 98.5 | 98.5 | 98.0 | 97.8 | 96.3 | 90.4 | 81.3 | $TaB_2$, |
|  |  | TC | 0.220 | 0.215 | 0.210 | 0.201 | 0.195 | 0.150 | 0.075 | TaC, |
|  |  | PS | <0.5 | 1.2 | 3.8 | 4.5 | 2.9 | 1.3 | <0.5 | TaN |
| 104–110 | $MoO_3$ | RD | 98.5 | 98.5 | 98.5 | 98.5 | 97.3 | 91.8 | 83.5 | $Mo_2B$, |
|  |  | TC | 0.230 | 0.223 | 0.225 | 0.230 | 0.218 | 0.175 | 0.083 | $Mo_2C$ |
|  |  | PS | <0.5 | 1.3 | 4.3 | 6.5 | 2.8 | 1.5 | <0.5 |  |
| 111–117 | $WO_3$ | RD | 98.5 | 98.5 | 98.5 | 98.3 | 97.1 | 91.5 | 83.0 | $W_2B$, |
|  |  | TC | 0.231 | 0.225 | 0.223 | 0.225 | 0.215 | 0.170 | 0.081 | $W_2C$ |
|  |  | PS | <0.5 | 1.2 | 4.1 | 5.8 | 2.5 | 1.3 | <0.5 |  |
| 118–124 | Mo + $MoO_3$ (1:1) | RD | 98.0 | 98.0 | 97.8 | 97.0 | 96.3 | 90.0 | 79.8 | $Mo_2B$, |
|  |  | TC | 0.221 | 0.211 | 0.205 | 0.198 | 0.189 | 0.148 | 0.070 | $Mo_2C$ |
|  |  | PS | <0.5 | 1.1 | 2.5 | 3.1 | 2.0 | 1.1 | <0.5 |  |

Notes
*Amount is given in parts by weight (in terms of metal element), based on 100 parts by weight of AlN.
RD: Relative density
TC: Thermal conductivity (RT) (cal/cm · sec. °C.)
PS: Peeling strength (kg/mm²)
**Composition of starting material 2. An aluminum nitride-base sintered body with high thermal conductivity, excellent wettability to metal and a specific resistivity of at least $10^9$ ohm-cm which:
   (a) consists essentially of
   100 parts by weight of aluminum nitride and 0.1–10 parts by weight, of at least one metal boride of elements of Groups 4a (Ti, Zr, Hf), 5a (V, Nb and Ta) and 6a (Cr, Mo, W) of the International Periodic Table, and at least one metal nitride of elements of said Groups 4a and 5a, calculated as the metal of said at least one metal boride and metal nitride and
   (b) has a mean crystal grain size not exceeding 10 μm.

3. An aluminum nitride-base sintered body with high thermal conductivity, excellent wettability to metal and a specific resistivity of at least $10^9$ ohm-cm which consists essentially of
   100 parts by weight of aluminum nitride and 0.1–10 parts by weight, of at least one metal nitride of elements of Groups 4a (ti, Zr, Hf) and 5a (V, Nb and Ta) of the International Periodic Table calculated as the metal of said at least one metal nitride.

4. An aluminum nitride-base sintered body with high thermal conductivity, excellent wettability to metal and a specific resistivity of at least $10^9$ ohm-cm which:
   (a) consists essentially of:
   100 parts by weight of aluminum nitride and 0.1–10 parts by weight, of at least two components selected from the group consisting of metal borides and metal carbides, the borides being of elements of Groups 4a (Ti, Zr, Hf), 5a (V, Nb and Ta) and 6a (Cr, Mo, W) of the International Periodic Table, and the carbides being of elements of said Groups 4a, 5a and 6a, wherein at least one of said components is any one of said borides and at least one of said components is any one of the carbides, calculated as the metal of said at least two components and
   (b) has a mean crystal grain size not exceeding 10 μm.

5. An aluminum nitride-base sintered body with high thermal conductivity, excellent wettability to metal and a specific resistivity of at least $10^9$ ohm-cm which consists essentially of:
   100 parts by weight of aluminum nitride and 0.1–10 parts by weight, of at least two components selected from the group consisting of metal nitrides and metal carbides, the nitrides being of elements of Groups 4a (Ti, Zr, Hf) and 5a (V, Nb and Ta) of the International Periodic Table, and the carbides being of elements of said Groups 4a, 5a and Group 6a (Cr, Mo, W) of said International Periodic Table, calculated as the metal of said at least two components wherein at least one of said components is any one of said nitrides and at least one of said components is any one of the carbides.

6. The aluminum nitride-base sintered body according to claim 1, 2, 3, 4 or 5, wherein said elements of Groups 4a, 5a and 6a are Ti, Ta, Mo and W.

7. The aluminum nitride-base sintered body according to claim 1, 2, 3, 4 or 5, wherein said at least two components amount to 1–5 parts by weight, based on the weight of the metal, based on 100 parts by weight of AlN.

8. The aluminum nitride-base sintered body according to claim 1, 2 or 4, wherein the boride of said elements is $Mo_2B$, $W_2B$ or a mixture thereof.

9. The aluminum nitride-base sintered body according to claim 4, wherein said at least two components containing said elements are selected from the group consisting of a combination of $Mo_2B$ and $Mo_2C$, and a combination of $W_2B$ and $W_2C$.

10. The aluminum nitride-base sintered body according to claim 3, 4 or 5, which has a mean crystal grain size not exceeding 10 μm.

11. The aluminum nitride-base sintered body according to claim 1, 2, 3, 4 or 5, which has specific resistivity of at least $10^{12}$ Ω-cm.

12. Tha nitride-base sintered body according to claim 1, 2, 3 4 or 5, which has a thermal conductivity of at least about 0.15 cal/cm sec °C. at room temperature.

13. The aluminum nitride-base sintered body according to claim 1, 2, 3 4 or 5, which has a peeling strength of the metallic layer of at least 1.0 kg/mm².

14. The aluminum nitride-base sintered body according to claim 1, in which said boride amounts to 1–5 parts by weight based on the weight of the metal.

15. The aluminum nitride-base sintered body according to claim 1, in which said at least one boride and nitride amount to 1–5 parts by weight based on the weight of the metal.

16. The aluminum nitride-base sintered body according to claim 3, in which said nitride amounts to 1–5 parts by weight based on the weight of the metal.

17. The aluminum nitride-base sintered body according to claim 4 or 5, in which said at least two components amount to 1–5 parts by weight based on the weight of the metal.

18. The aluminum nitride-base sintered body according to claim 14, 15 or 16, which has a peeling strength for a metallized layer of at least 2 kg/cm².

19. The aluminum nitride-base sintered body according to claim 17, which has a peeling strength for a metallized layer of at least 2 kg/cm².

20. The aluminum nitride-base sintered body according to claim 14, in which said boride amounts to 1–3 parts by weight based on the weight of the metal.

21. The aluminum nitride-base sintered body according to claim 15, in which said at least one boride and nitride amount to 1–3 parts by weight based on the weight of the metal.

22. The aluminum nitride-base sintered body according to claim 16, in which said nitride amounts to 1–3 parts by weight based on the weight of the metal.

23. The aluminum nitride-base sintered body according to claim 17, in which said at least two components amount to 1–3 parts by weight based on the weight of the metal.

24. The aluminum nitride-base sintered body according to claim 1, 2, 3, 4 or 5, which has a mean crystal grain size of at least 0.5 μm.

25. The aluminum nitride-base sintered body according to claim 24, which has a mean crystal grain size of 2–5 μm.

26. An insulating substrate for an electronic circuit comprising an aluminum nitride-base sintered body with high thermal conductivity, excellent wettability to metal and a specific resistivity of at least $10^9$ ohm-cm consisting essentially of:
   100 parts by weight of aluminum nitride and 0.1–10 parts by weight, of at least one component selected from the group consisting of metal borides of elements of Groups 4a (Ti, Zr, Hf), 5a (V, Nb and Ta) and 6a (Cr, Mo, W) of the International Periodic Table and metal nitrides of elements of said Groups 4a and 5a of the International Periodic Table calculated as the metal of said at least one metal boride and metal nitride.

27. An insulating substrate for an electronic circuit comprising an aluminum nitride-base sintered body with high thermal conductivity, excellent wettability to metal and a specific resistivity of at least $10^9$ ohm-cm consisting essentially of:
100 parts by weight of aluminum nitride and 0.1-10 parts by weight, based on the weight of metal, of at least two components selected from the group consisting of metal borides, metal nitrides and metal carbides, the borides and carbides being of elements of Groups 4a (Ti, Zr, Hf), 5a (V, Nb and Ta) and 6a (Cr, Mo, W) of the International Periodic Table, and the nitrides being of elements of said Groups 4a and 5a of the International Periodic Table, calculated as the metal of said at least two components wherein at least one of said components is at least one of said borides and nitrides and at least one of the components is any one of the carbides.

28. A heat sink comprising an aluminum nitride-base sintered body with high thermal conductivity, excellent wettability to metal and a specific resistivity of at least $10^9$ ohm-cm consisting essentially of:
100 parts by weight of aluminum nitride and 0.1-10 parts by weight, of at least one component selected from the group consisting of metal borides of elements of Groups 4a (Ti, Zr, Hf), 5a (V, Nb and Ta) and 6a (Cr, Mo, W) of the International Periodic Table and metal nitrides of elements of said Groups 4a and 5a of the International Periodic Table calculated as the metal of said at least one component.

29. A heat sink comprising an aluminum nitride-base sintered body with high thermal conductivity, excellent wettability to metal and a specific resistivity of at least $10^9$ ohm-cm consisting essentially of:
100 parts by weight of aluminum nitride and 0.1-10 parts by weight, of at least two components selected from the group consisting of metal borides, metal nitrides and metal carbides, the borides and carbides being of elements of Groups 4a (Ti, Zr, Hf), 5a (V, Nb and Ta) and 6a (Cr, Mo, W) of the International Periodic Table, calculated as the metal of said at least two components, and the nitrides being of elements of said Groups 4a and 5a, wherein at least one said components is at least one of said borides and nitrides and at least one of said components is any one of the carbides.

30. The insulating substrate according to claim 26 in which said at least one component amounts to 1-5 parts by weight based on the weight of the metal.

31. The insulating substrate according to claim 27 in which said at least two components amount to 1-5 parts by weight based on the weight of the metal.

32. The heat sink according to claim 28, in which said at least one component amounts to 1-5 parts by weight based on the weight of the metal.

33. The heat sink according to claim 29, in which said at least two components amount to 1-5 parts by weight based on the weight of the metal.

34. The aluminum nitride-base sintered body according to claims 1, 2, 3, 4 or 5, wherein the density of the sintered body is at least 90% of theoretical density.

35. The aluminum nitride-base sintered body of claims 1, 2, 3, 4 or 5, wherein the density of the sintered body is at least 95% of theoretical density.

* * * * *